United States Patent
Imamura (10) Patent No.: US 7,833,910 B2
(45) Date of Patent: Nov. 16, 2010

(54) FILM SUBSTRATE, FABRICATION METHOD THEREOF, AND IMAGE DISPLAY SUBSTRATE

(75) Inventor: Hiroyuki Imamura, Settsu (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 12/230,511

(22) Filed: Aug. 29, 2008

(65) Prior Publication Data

US 2009/0011591 A1     Jan. 8, 2009

Related U.S. Application Data

(62) Division of application No. 11/043,946, filed on Jan. 28, 2005, now Pat. No. 7,425,766.

(30) Foreign Application Priority Data

Feb. 2, 2004   (JP)   ............... 2004-024948
Nov. 25, 2004  (JP)   ............... 2004-339695

(51) Int. Cl.
    *H01L 21/311*   (2006.01)
(52) U.S. Cl. .............. 438/703; 257/E21.495; 257/775; 438/694; 349/150
(58) Field of Classification Search .......... 438/618, 438/703
See application file for complete search history.

(56) References Cited

U.S. PATENT DOCUMENTS

| | | | | |
|---|---|---|---|---|
| 5,963,287 | A * | 10/1999 | Asada et al. | 349/150 |
| 6,217,987 | B1 | 4/2001 | Ono et al. | |
| 6,320,135 | B1 | 11/2001 | Saito | |
| 6,744,123 | B2 * | 6/2004 | Koyanagi | 257/668 |
| 6,903,794 | B2 | 6/2005 | Fukuta et al. | |
| 2003/0178724 | A1 | 9/2003 | Koyanagi | |
| 2004/0097086 | A1 * | 5/2004 | Igarashi et al. | 438/690 |
| 2006/0054349 | A1 * | 3/2006 | Iguchi | 174/255 |

FOREIGN PATENT DOCUMENTS

| | | |
|---|---|---|
| JP | 05-095208 | 4/1993 |
| JP | 06-342827 | 12/1994 |
| JP | 2002-026055 | 1/2002 |
| JP | 2002-223052 A | 8/2002 |
| JP | 3-115511 | 4/2003 |
| JP | 2003-142535 | 5/2003 |
| JP | 2003-203951 | 7/2003 |
| JP | 2004-281947 | 10/2004 |

* cited by examiner

*Primary Examiner*—Ajay K Arora
(74) *Attorney, Agent, or Firm*—Steptoe & Johnson LLP (57) ABSTRACT

In a film substrate (FB) including a film base material (1) and conductor wiring (23) that is formed on the film base material (1), the conductor wiring (23) is arranged such that the conductor wiring thickness of an external connection portion on the film substrate to which another panel or substrate is connected is thicker than the conductor wiring thickness of conductor wiring portions (bent portions) (25) at other positions.

4 Claims, 7 Drawing Sheets

FIG. 1A (X-X' VIEW)

FIG. 1B

FIG. 1C (Y-Y' VIEW)

[PLAN VIEW] [X-X' CROSS-SECTIONAL VIEW]

[PLAN VIEW] [X-X' CROSS-SECTIONAL VIEW]

FILM SUBSTRATE, FABRICATION METHOD THEREOF, AND IMAGE DISPLAY SUBSTRATE

BACKGROUND OF THE INVENTION

1. Field of the Invention

The present invention relates to a film substrate that is mounted in an image display flat panel or the like and, more particularly, to a conductor-wiring structure for the film substrate and the fabrication method thereof.

2. Description of the Related Art

One form of semiconductor package that is mounted in an image display flat panel or the like is a tape carrier package, which is mainly used as a driver for driving purposes. Among such tape carrier packages, a tape carrier package in which holes in the film base material are not formed in semiconductor element mount portions of the film base material in particular is known as COF (Chip On Film; a mounting structure that uses a thin film for the substrate and in which the chip and circuit on the film substrate are electrically connected by means of bumps).

A commonly known film substrate with the COF structure is disclosed in Japanese Patent Application Laid Open No. 2002-223052, for example. The film substrate disclosed in this publication is a flexible substrate that is connected to the substrate of a liquid-crystal display panel. Further, the film substrate comprises a film base material on which active elements such as semiconductor chips, passive elements such as resistors and condensers, and mechanical parts, and so forth, are mounted, wherein a plurality of terminals formed from copper thin film exist in the vicinity of a terminal portion that is connected to the liquid-crystal display panel on the film base material.

The film substrate and the substrate of the liquid crystal display panel are connected by means of an ACF (Anisotropic Conductive Film). The ACF is formed in a state in which conductive particles are distributed scattered within an insulating resin. The film substrate and the substrate of the liquid crystal display panel are bonded together by means of the insulating resin by subjecting the film substrate and the substrate of the liquid crystal display panel to thermo-compression bonding with the ACF interposed therebetween and, thus, each of the terminals of the film substrate and the electrodes or connecting terminals facing the substrate of the liquid crystal display panel are conductively connected by means of conductive particles.

Furthermore, each of the terminals of the film substrate and the elements and parts that are mounted on the film substrate are connected by means of conductive wiring that is formed on the film base material. A method that forms the conductive wiring by etching a metal foil on the film base material and a method that forms the conductive wiring directly on the film base material by means of metal plating are known.

Further, the increasing number of output terminals of semiconductor elements that are mounted on film substrates and the reductions in the size of semiconductor elements as a result of the increased detail of liquid crystal display panels in recent years has been accompanied by the trend in the annually decreasing pitch of semiconductor-element mount portions of film substrates and of parts with conductor wiring in the vicinity of the mount portions (conductor wiring portions) and, hence, there is a desire for a reduction in the pitch of conductor wiring portions. In order to implement a reduction in the pitch of conductor wiring portions, a decrease in the thickness of conductor wiring portions is advantageous for the two above methods, that is, for both the method that forms conductor wiring portions by etching and metal foil on the film base material and the method that forms the conductor wiring portion directly on the film base material by means of metal plating. However, when the thickness of a conductor wiring portion is reduced, the gap between the film substrate and the substrate of the liquid crystal display panel is then smaller at the join with the substrate of the liquid crystal display panel and the density of conductive particles in the ACF increases. As a result, short circuit failure between electrodes of the substrate of the liquid crystal display panel, between connecting terminals, or between conductor wiring of the film substrate readily occurs.

Furthermore, the film substrate is sometimes bent and connected to the substrate of the liquid crystal display panel by making use of the flexibility the film substrate. Here, when the thickness of the part in which the film substrate is bent (bent portions) is large, the radius of curvature of the conductor wiring portion is large and the conductor wiring portion readily breaks.

SUMMARY OF THE INVENTION

The present invention accordingly solves these problems and it is an object thereof to provide a film substrate that makes it possible to reduce the pitch of the conductive wiring portion, secure insulation at the join between the substrate and another panel such as a liquid crystal display panel, and that possesses a greater bend strength and to provide a fabrication method for the film substrate.

In order to achieve this object, the film substrate of the present invention is a film substrate on which a semiconductor element is mounted and that is mounted on another panel or substrate, comprising a film base material; and conductor wiring that is formed on the film base material and comprises a semiconductor connection portion to which the semiconductor element is connected and an external connection portion on the film substrate to which the other panel or substrate is connected, wherein the conductor wiring thickness of the semiconductor connection portion of the conductor wiring and of the external connection portion on the film substrate of the conductor wiring is formed more thickly than the conductor wiring thickness of the conductor wiring portion at other positions.

According to this constitution, the conductive wiring thickness of external connection portions on the film substrate is greater than the conductive wiring thickness of the conductive wiring portion at other positions, and, hence, when the external connection portions on the film substrate are joined to electrodes (or terminals) of the substrate of the liquid crystal display panel, for example, by means of ACF, the density of the conductive particles in the ACF is reduced, whereby short circuit failure between the conductor wiring or electrodes is not readily produced and insulation between the electrodes and conductor wiring is secured. Further, the conductor wiring thickness of the conductor wiring portion at other positions can be made thin so that the radius of curvature of the same conductor wiring portion can be reduced in comparison with a case where the conductor wiring thickness is large, whereby the bend strength can be increased. In addition, because the conductor wiring thickness of semiconductor connection portions as well as the external connection portions on the film substrate is greater than the conductor wiring thickness of the conductor wiring portions at other positions, the thick parts can replace protruding electrodes, whereby the step of forming protruding electrodes on the side of the semiconductor element can be omitted.

Moreover, the film substrate fabrication method of the present invention forms conductor wiring by means of a first conductor, forms a second conductor on the first conductor by means of metal plating at the semiconductor connection portion of the conductor wiring and the external connection portion on the film substrate, and forms the conductor wiring thickness of the semiconductor connection portion and the external connection portion on the film substrate more thickly than the conductor wiring thickness of the conductor wiring portion at other positions.

DESCRIPTION OF THE PREFERRED EMBODIMENTS

Embodiments of the present invention will be described hereinafter with reference to the drawings.

Film Substrate

Figure 1A:
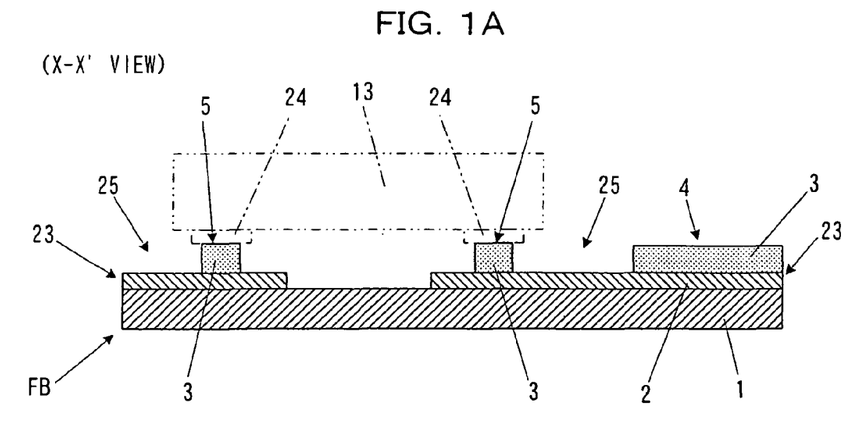
FIG. 1A is a cross-sectional view along the line X-X' of FIG. 1B.
Figure 1B:
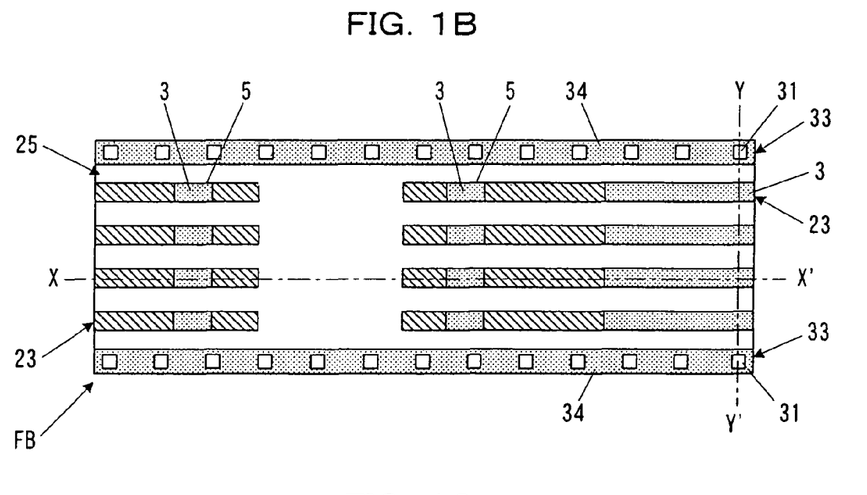
FIG. 1B is a plan view of a film substrate of an embodiment of the present invention.
Figure 1C:
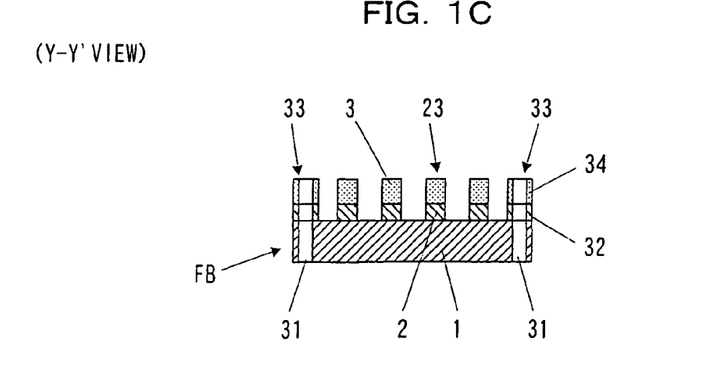
FIG. 1C is a cross-sectional view along the line Y-Y' of FIG. 1B.

FIG. 1A to 1C each shows a part of the film substrate of an embodiment of the present invention.

In FIGS. 1A to 1C, FB is a film substrate on which a semiconductor element 13 is mounted. The film substrate FB consists of a flexible and insulating film base material 1 and conductor wiring 23 that is formed on the film base material 1 and to which the semiconductor element 13 is connected.

Figure 3:
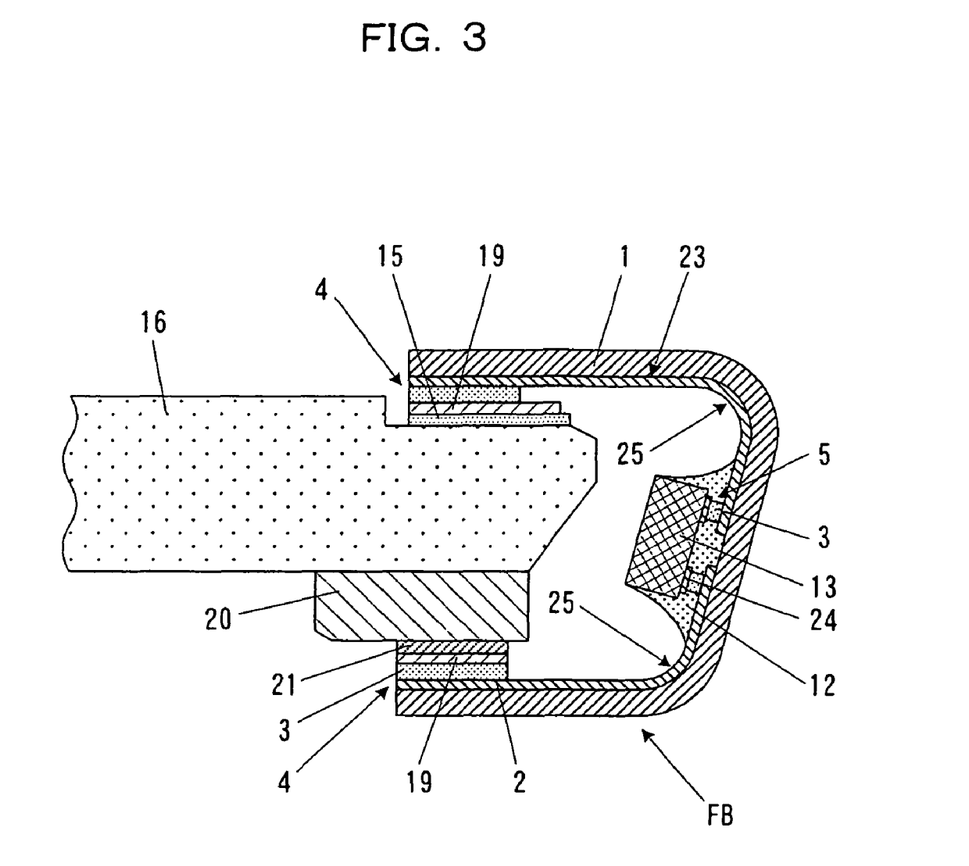
FIG. 3 is a cross-sectional view showing a state where the film substrate is connected to an image-display flat panel.

The conductor wiring 23 comprises, for example, external connection portions 4 on the film substrate that are joined to electrodes (or terminals) 15 of an image-display flat panel (liquid crystal display panel; an example of another panel) 16 shown in FIG. 3 and the electrodes (or terminals) 21 of a print substrate (an example of another substrate) 20 of the image-display flat panel 16; and semiconductor connection portions (mount portions) 5 to which the semiconductor element 13 is connected. Further, the connection between the conductor wiring 23 and the semiconductor element 13 is protected by means of the sealing resin 12.

Further, the thickness of the conductor wiring (conductor wiring thickness) of parts of the conductor wiring 23 that can be bent (hereinafter such parts are called 'bent portions') 25, which are parts to which peripheral and other parts of the semiconductor element 13 are not connected, is made thin and the conductor wiring thickness of the external connection portions 4 on the film substrate and the semiconductor connection portions 5 is made larger than the conductor wiring thickness of the bent portions 25. Further, the conductor wiring 23 is formed from first conductor wiring 2 (described subsequently), or from the first conductor wiring 2 and second conductor wiring 3.

Furthermore, film conveyance film holes 31 for conveying the film substrate FB are arranged in a row at the two ends that run parallel to the conveyance direction (X-X' direction) of the film substrate FB of the film base material 1. A first reinforcement conductor 32 is formed at the periphery of the film conveyance film holes 31 in order to reinforce the strength of the holes 31 and a second reinforcement conductor 34 is formed on the first reinforcement conductor 32, whereby a reinforcement conductor portion 33 is formed. The thickness of the first reinforcement conductor 32 and of the second reinforcement conductor 34 (reinforcement conductor thickness) of the reinforcement conductor portion 33 is made higher than the conductor wiring thickness of the conductor wiring portions at other positions (the bent portions 25), similarly to the conductor wiring thickness of the external connection portions 4 on the film substrate and the semiconductor connection portions 5.

The operation results of this constitution will now be described.

First, when forming the film substrate FB for mounting the semiconductor element 13, whereon the pitch of the conductor wiring 23 is small, the conductor wiring thickness at the periphery of the connection portions 5 of the semiconductor element 13 (bent portions 25) is small and, therefore, the conductor wiring 23 is easily formed.

Figure 2A:
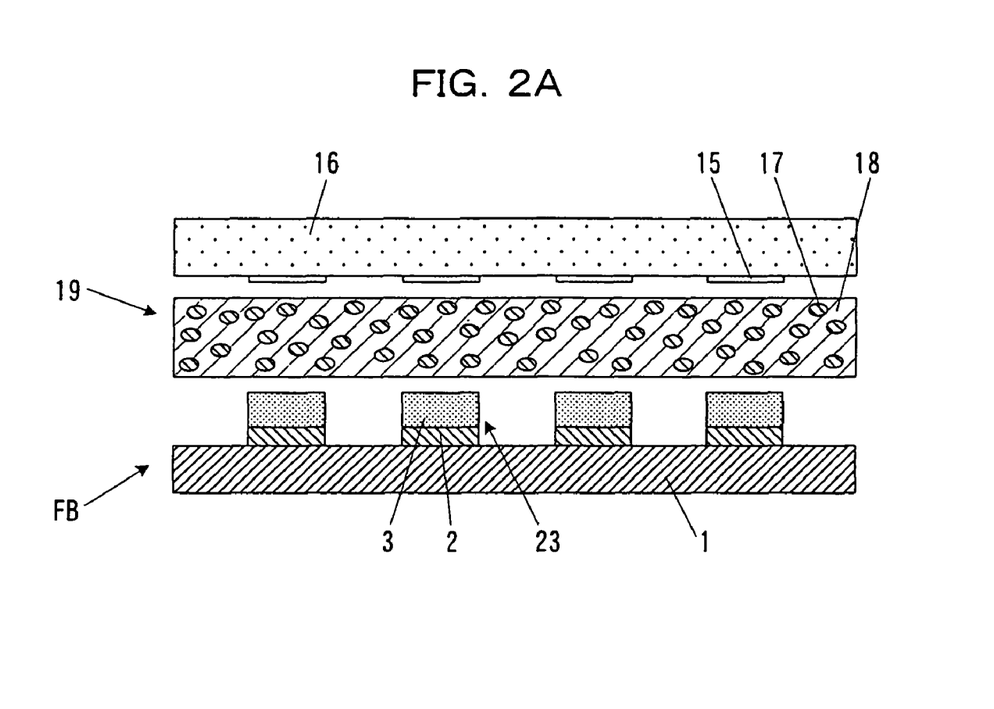
FIGS. 2A and 2B are cross-sectional views corresponding to FIG. 1C taken along the line Y-Y', and showing states where the film substrate is connected to an image-display flat panel.
Figure 2B:
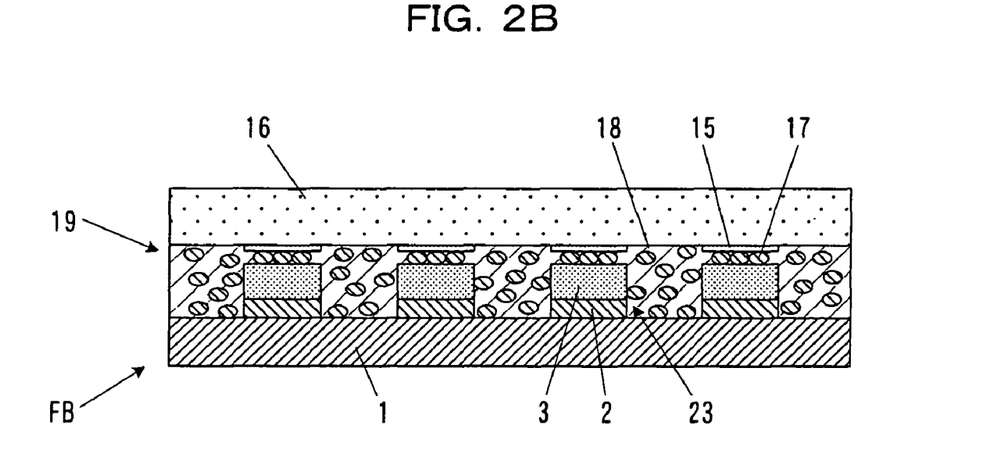

Moreover, as shown in FIG. 2, when an ACF 19 that comprises conductive particles 17 in an insulating resin 18 is interposed and bonded between the external connection portions 4 of the film substrate FB and the electrode 15 of the image-display flat panel substrate 16, the external connection portions 4 have a large conductor wiring thickness and, therefore, the gap between the film base material 1 and the image-display flat panel substrate 16 at the join can be sufficiently secured. Accordingly, the density of the conductive particles 17 in the ACF 19 becomes small and short circuits at the join do not readily occur, whereby insulation can be secured.

Furthermore, as shown FIG. 3, the conductor wiring thickness of the bent portions 25 is low and, therefore, flexural strength can be secured. It is known from experimentation and so forth that the effects of the invention above are satisfied if the conductor wiring thickness here is from 6 µm to 15 µm for the external connection portions 4 on the film substrate that connects to the flat panel substrate 16 and from 4 µm to 10 µm for the bent portions 25 to which no other part is connected, for example. Further, this is because, although the suitable ranges for the external connection portions 4 on the film substrate and for the bent portions 25 to which no other part is connected overlap here, the most suitable conductor wiring thickness range differs depending on the pitch of the conductor wiring in each of the conductor wiring portions.

Therefore, because it is possible to secure adequately the gap at the join with the image-display flat panel 16 while reducing the pitch of the conductor wiring 23, the wiring density increases and it is therefore possible to provide a film substrate FB for which mounting on the image-display flat panel 16 is favorable.

In addition, the conductor wiring thickness of the semiconductor connection portions 5 is larger than the conductor wiring thickness of the bent portions 25 and the thick parts of the conductor wiring of the semiconductor connection portions 5 serve to replace the protruding electrodes. Therefore, the step of forming protruding electrodes on the side of the semiconductor elements can be omitted. Here, it is understood from experimentation and so forth that, if the semiconductor connection portions 5 are constituted to protrude in the conductor thickness direction by 5 μm to 20 μm from the adjacent conductor wiring 23, for example, the semiconductor connection portions 5 adequately replace protruding electrodes. Further, the conductor wiring thickness of the semiconductor connection portions 5 need not necessarily be larger than the conductor wiring thickness of the bent portions 25 (the step of forming protruding electrodes is required here) and the conductor wiring thickness of at least the external connection portions on the film substrate (the connection with the image-display panel) 4 may be larger than the conductor wiring thickness of the bent portions 25.

Furthermore, because the reinforcement conductor thickness of the reinforcement conductor portion 33 is made larger than the conductor wiring thickness of the conductor wiring portions at other positions (bent portions 25) similarly to the conductor wiring thickness of the external connection portions 4 on the film substrate and the semiconductor connection portions 5, the strength of the film conveyance film holes 31 for conveying the film substrate FB can be increased still further and, because same are thicker than the bent portions 25, stable production in which the strength of the film holes 31 during film conveyance is high becomes possible.

Film Substrate Fabrication Methods

Fabrication methods for the film substrate FB with the above constitution will now be described. There are mainly the following three fabrication methods.

First Fabrication Method

FIGS. 4A to 4E are plan views showing a part of the film substrate FB and cross-sectional views corresponding to positions along the line X-X' that sequentially illustrate the fabrication steps of a film substrate fabrication method (first method) of the present invention.

Figure 4A:
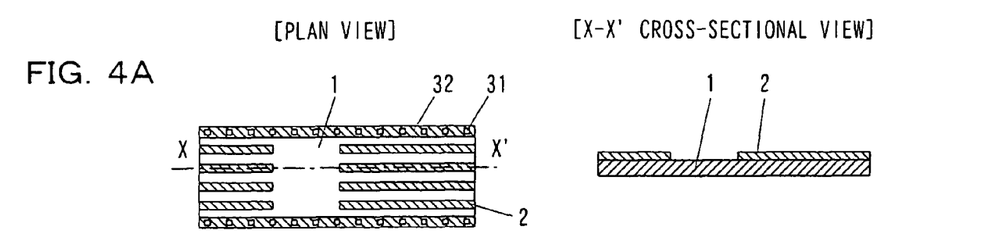
FIGS. 4A to 4E respectively illustrate fabricating steps of a first fabricating method of the film substrate, each showing a plan view of a part of the film substrate and a cross-section thereof along the line X-X'.

As shown in FIG. 4A, the first method employs a film base material 1 on which first conductor wiring 2 (conductor wiring 23) to which the semiconductor element 13 is connected, and the reinforcement conductor 32 (of the same thickness as the conductor wiring 23; referred to as 'the first reinforcement conductor' hereinbelow) is formed at the periphery of the film conveyance film holes 31 for the reinforcement conductor portion 33 are formed.

First Step

Figure 4B:
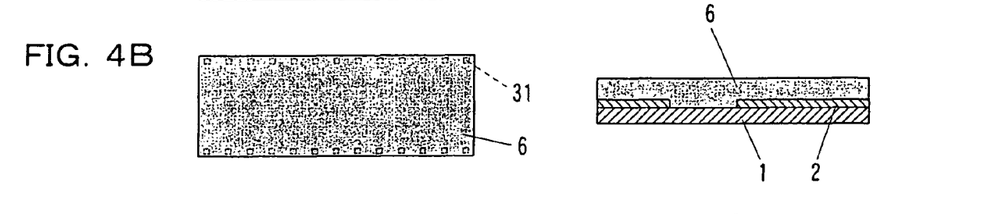

First, as shown in FIG. 4B, a photoresist 6 is formed on the surface of the film base material 1 on which the first conductor wiring 2 (conductor wiring 23) and the first reinforcement conductor 32 are formed.

Second Step

Figure 4C:
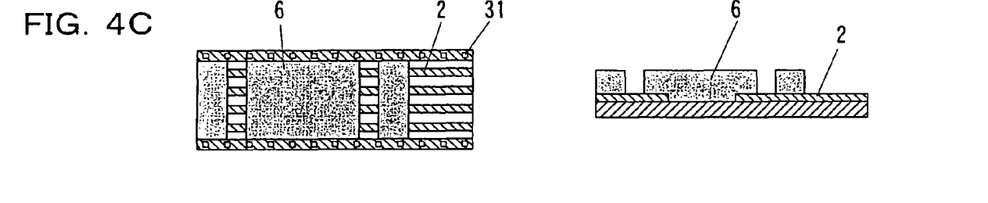

Thereafter, as shown in FIG. 4C, part of the first conductor wiring 2 and the first reinforcement conductor 32 are exposed by forming openings in the photoresist 6 in the position of the external connection portions 4 on the film substrate, the positions of the semiconductor connection portions 5 and the position of the reinforcement conductor portion 33.

Third Step

Figure 4D:
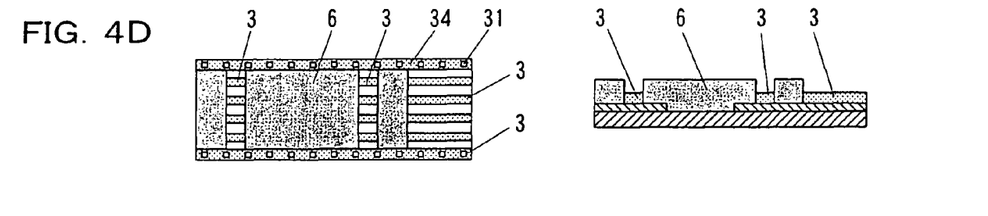

Next, as shown in FIG. 4D, the second conductor wiring 3 is formed on the first conductor wiring 2 at the openings in the photoresist 6 and the second reinforcement conductor 34 is formed on the first reinforcement conductor 32 by performing metal plating.

Fourth Step

Figure 4E:
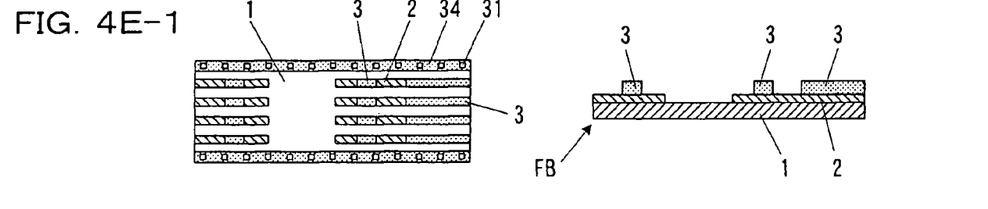

Next, the photoresist 6 is removed as shown in FIG. 4E1.

According to the first fabrication method above, in order to be able to adjust the conductor wiring thickness at any given position on the film base material 1, the film substrate FB shown in FIG. 1, that is, the film substrate FB on which the conductor wiring thickness of the external connection portions 4 on the film substrate and the semiconductor connection portions 5 of the conductor wiring 23 is greater than the conductor wiring thickness of the bent portions 25 can be easily fabricated.

Further, the step of forming the semiconductor connection portions 5 with a large conductor wiring thickness and the step of forming the external connection portions 4 on the film substrate with a large conductor wiring thickness can be combined in the same formation step, whereby the steps can be shortened.

Further, the step of forming the reinforcement conductor portion 33 with a large conductor wiring thickness, which is constituted by the first reinforcement conductor 32 and second reinforcement conductor 34 and the step of forming the external connection portions 4 on the film substrate with a large conductor wiring thickness can be combined in the same formation step, whereby the steps can be shortened.

Further, although not illustrated, the film conveyance film holes 31 need not necessarily be formed prior to the formation of the second reinforcement conductor 34 and may, instead, be formed following formation of the second reinforcement conductor 34.

Figure 4E:
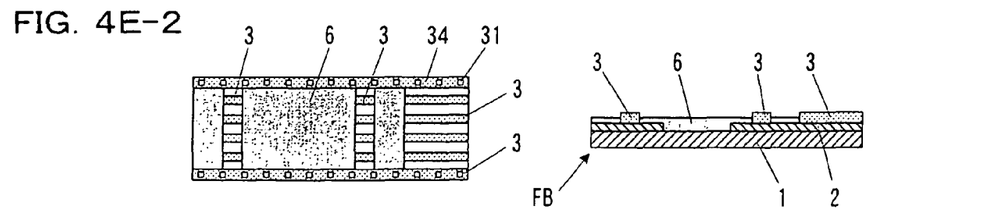

Furthermore, although the photoresist 6 is completely removed in the fourth step, when the photoresist 6 possesses sufficient flexibility to bending, same is not completely removed and regions excluding the external connection portions 4 on the film substrate and the semiconductor connection portions 5 of the conductor wiring 23 may be covered by an insulating film (photoresist 6) with a lower thickness than the semiconductor connection portions 5 and external connection portions 4 on the film substrate, as shown in FIG. 4E2. As a result, the strength of regions excluding the semiconductor connection portions 5 and the external connection portions 4 on the film substrate of the conductor wiring 23 can be secured by means of the photoresist 6 (is able to fulfill the role of a solder resistor) and, by reducing the thickness as detailed earlier, a highly reliable join and connection can be implemented without being affected by the repulsive force of the photoresist 6 when the film substrate is joined to the image-display flat panel substrate 16 or connected to the semiconductor element 13.

Second Fabrication Method

FIGS. 5A to 5I are planar views showing a part of the film substrate FB and cross-sectional views thereof corresponding to the position Y-Y' that sequentially illustrate the fabrication steps of a film substrate fabrication method (second method) of the present invention.

Figure 5A:
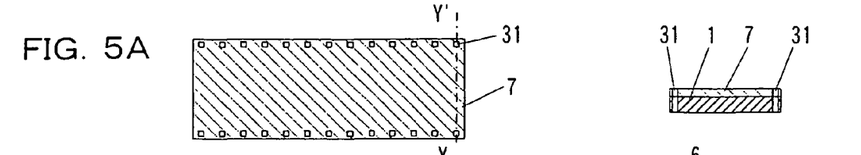
FIGS. 5A to 5I respectively illustrate fabricating steps of a second fabricating method of the film substrate, each showing a plan view of a part of the film substrate and a cross-section thereof along the line Y-Y'.

As shown in FIG. 5A, the second method employs a film base material 1 in which film conveyance film holes 31 are formed and at least the whole of one surface of which is covered by a metal sublayer 7.

First Step

Figure 5B:
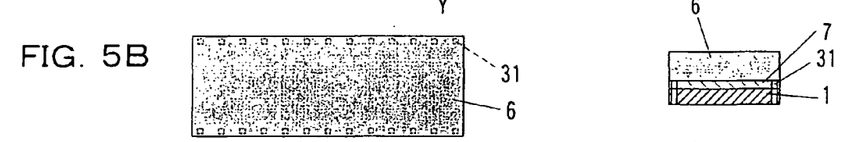

First, as shown in FIG. 5B, a first photoresist 6 is formed on the surface of the film base material 1 on which the metal sublayer 7 is provided.

Second Step

Figure 5C:
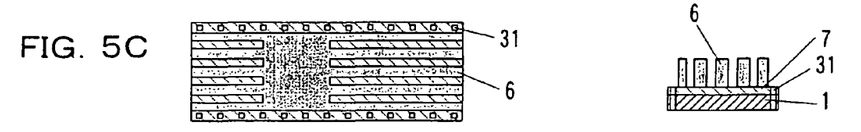

Thereafter, as shown in FIG. 5C, the metal sublayer 7 is partially exposed by forming openings in the first photoresist 6 in the position of the conductor wiring 23 where the semiconductor element 13 is mounted and in the position of the reinforcement conductor portion 33 in which the film conveyance film holes 31 are formed.

Third Step

Figure 5D:
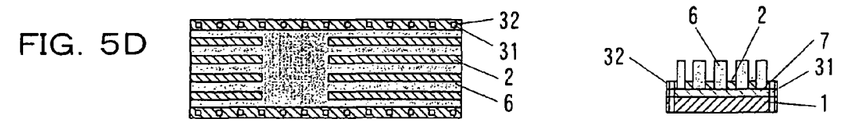

Thereafter, as shown in FIG. 5D, first conductor wiring 2 (conductor wiring 23 of the semiconductor element 13) and the first reinforcement conductor 32 are formed at the openings in the first photoresist 6 by performing metal plating.

Fourth Step

Figure 5E:
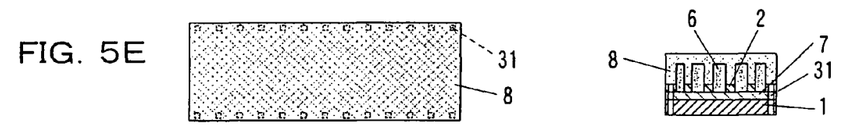

Thereafter, as shown in FIG. 5E, a second photoresist 8 is formed on the surface of the film substrate that has been provided with the first conductor wiring 2 and the first reinforcement conductor 32.

Fifth Step

Figure 5F:
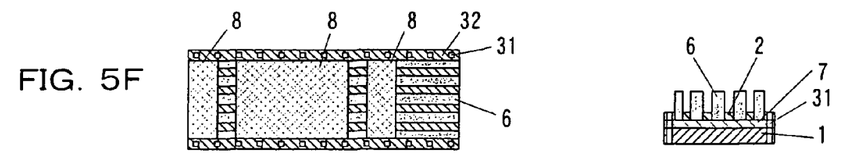

Thereafter, as shown FIG. 5F, the first reinforcement conductor 32 and part of the first conductor wiring 2 are exposed by forming openings in the photoresist 8 in the positions of the external connection portions 4 on the film substrate, the position of the semiconductor connection portions 5, and the position of the reinforcement conductor portion 33.

Sixth Step

Figure 5G:
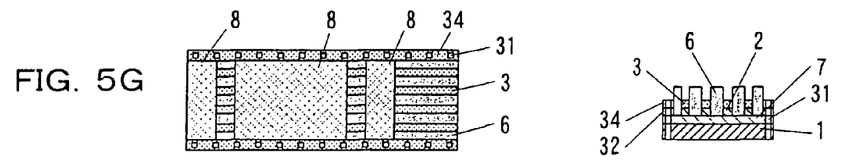

Thereafter, as shown in FIG. 5G, second conductor wiring 3 is formed on part of the first conductor wiring 2 and a second reinforcement conductor 34 is formed on the first reinforcement conductor 32 at the openings in the second photoresist 8 by performing metal plating.

Seventh Step

Figure 5H:
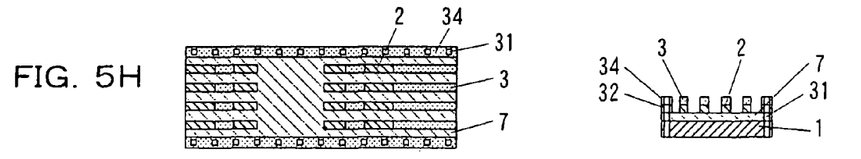

Thereafter, as shown in FIG. 5H, the first photoresist 6 and second photoresist 8 are removed.

Eighth Step

Figure 5I:
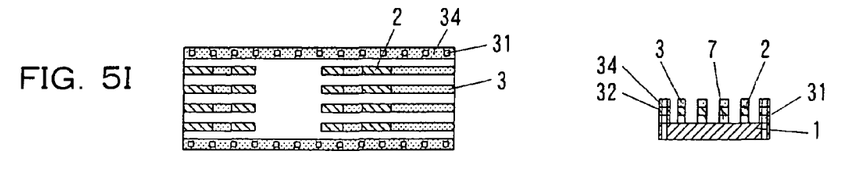

Thereafter, as shown in FIG. 5I, the conductor wiring 2 and conductor wiring 3 are electrically isolated by etching the metal sublayer 7 between the first conductor wiring 2.

So too with the second fabrication method above, in order to be able to adjust the conductor wiring thickness at any given position on the film base material 1, the film substrate FB shown in FIG. 1, that is, the film substrate FB, on which the conductor wiring thickness of the external connection portions 4 on the film substrate and of the semiconductor connection portions 5 of the conductor wiring 23 is greater than the conductor wiring thickness of the bent portions 25, can be easily fabricated.

Further, the step of forming the semiconductor connection portions 5 with a large conductor wiring thickness and the step of forming the external connection portions 4 with a large conductor wiring thickness can be combined in the same formation step, whereby the steps can be shortened.

Further, the step of forming the reinforcement conductor portion 33 with a large conductor wiring thickness, which is constituted by the first reinforcement conductor 32 and second reinforcement conductor 34 and the step of forming the external connection portions 4 on the film substrate with a large conductor wiring thickness can be combined in the same formation step, whereby the steps can be shortened.

Further, although not illustrated, the film conveyance film holes 31 need not necessarily be formed prior to the formation of the second reinforcement conductor 34 and may, instead, be formed after the formation of the second reinforcement conductor 34.

Third Fabrication Method

FIGS. 6A to 6I are planar views showing a part of the film substrate FB and cross-sectional views corresponding to the position X-X' that sequentially illustrate the fabrication steps of a film substrate fabrication method (third method) of the present invention.

Figure 6A:
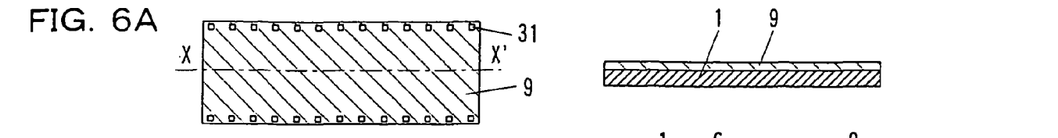
FIGS. 6A to 6I respectively illustrate fabricating steps of a third fabricating method of the film substrate, each showing a plan view of a part of the film substrate and a cross-section thereof along the line X-X'.

As shown in FIG. 6A, the third method employs a film base material 1 in which film conveyance film holes 31 are formed and at least the whole of one surface of which is covered by a first conductor 9.

First Step

Figure 6B:
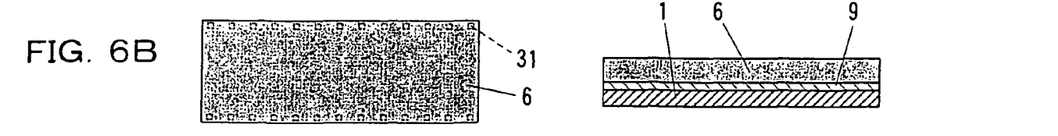

First, as shown in FIG. 6B, a first photoresist 6 is formed on the surface of a film base material 1 on which the first conductor 9 is provided.

Second Step

Figure 6C:
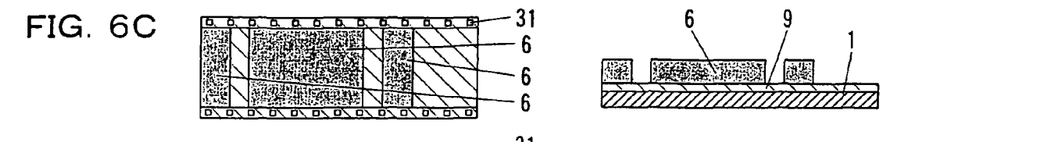

Thereafter, as shown in FIG. 6C, the first conductor 9 is partially exposed by forming openings in the first photoresist 6 in the positions of the external connection portions 4 on the film substrate, the positions of the semiconductor connection portions 5 and in the position of the reinforcement conductor portion 33 in which the film conveyance film holes 31 are formed.

Third Step

Figure 6D:
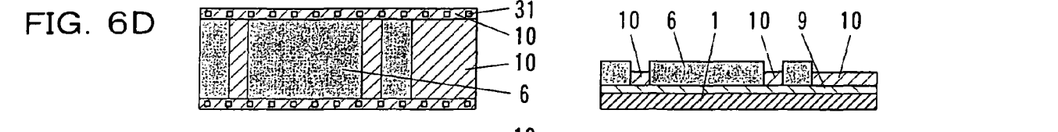

Thereafter, as shown in FIG. 6D, a second conductor 10 is formed on the first conductor 9 at the openings in the first photoresist 6 by performing metal plating.

Fourth Step

Figure 6E:
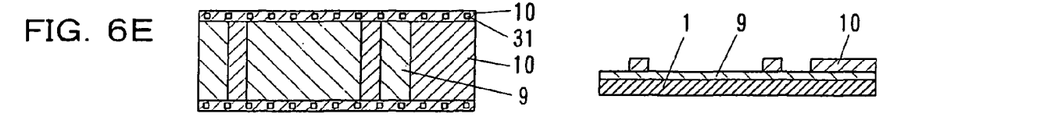

Thereafter, as shown in FIG. 6E, the first photoresist 6 is removed.

Fifth Step

Figure 6F:
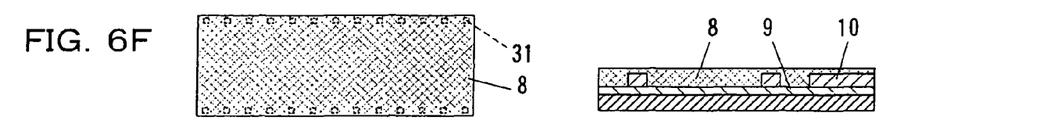

Thereafter, as shown FIG. 6F, a second photoresist 8 is formed on the surface that has been provided with the second conductor 10.

Sixth Step

Figure 6G:
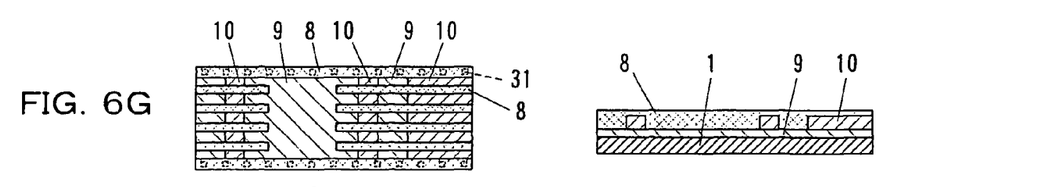

Thereafter, as shown in FIG. 6G, openings are formed in the second photoresist 8 in positions other than the positions of the conductor wiring 23 for connecting the semiconductor element 13 and in positions other than the positions of the reinforcement conductor portion 33.

Seventh Step

Figure 6H:
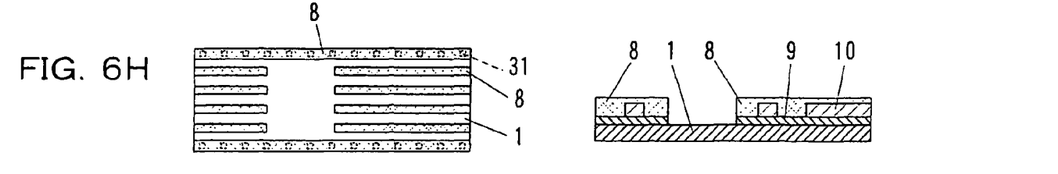

Thereafter, as shown in FIG. 6H, conductor wiring is formed by etching the first conductor 9 and the second conductor 10 at the openings in the second photoresist 8.

Eighth Step

Figure 6I:
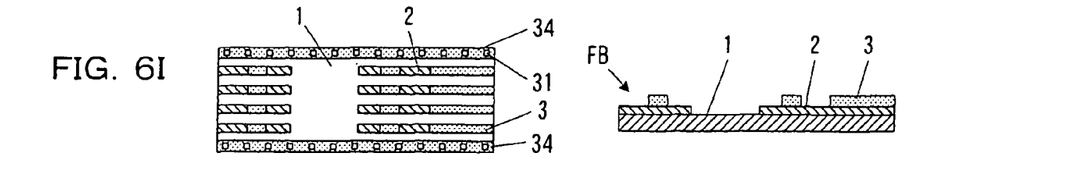

Thereafter, as shown in FIG. 6I, the second photoresist 8 is removed. The remaining first conductor 9 then becomes the first conductor wiring 2 of the conductor wiring 23 and the second conductor 10 becomes the second conductor 3 of the conductor wiring 23. Further, on the reinforcement conductor portion 33, the remaining first conductor 9 becomes the first reinforcement conductor 32 and the second conductor 10 becomes the second reinforcement conductor 34.

So too with the third fabrication method above, in order to be able to adjust the conductor wiring thickness at any given position on the film base material 1, the film substrate FB shown in FIG. 1, that is, the film substrate FB on which the conductor wiring thickness of the external connection portions 4 on the film substrate and the semiconductor connection portions 5 of the conductor wiring 23 is greater than the conductor wiring thickness of the bent portions 25 can be easily fabricated.

Further, the step of forming the semiconductor connection portions 5 with a large conductor wiring thickness and the step of forming the external connection portions 4 on the film substrate with a large conductor wiring thickness can be combined in the same formation step, whereby the steps can be shortened.

Further, the step of forming the reinforcement conductor portion 33 with a large conductor wiring thickness, which is constituted by the first reinforcement conductor 32 and second reinforcement conductor 34 and the step of forming the external connection portions 4 on the film substrate with a large conductor wiring thickness can be combined in the same formation step, whereby the steps can be shortened.

Further, although not illustrated, the film conveyance film holes 31 need not necessarily be formed prior to the formation of the second reinforcement conductor 34 and may, instead, be formed after the formation of the second reinforcement conductor 34.

In addition, the semiconductor element 13 is mounted on the film substrate FB with the above structure, that is, the film substrate FB whereon the conductor wiring thickness of the external connection portions 4 on the film substrate and the semiconductor connection portions 5 of the conductor wiring 23 is greater than the conductor wiring thickness of the bent portions 25 and the resulting film substrate is then mounted on the image-display flat panel substrate 16 to form an image-display device. In so doing, because the external connection portions 4 have a large conductor wiring thickness, the gap between the film base material 1 and the image-display flat panel substrate 16 at the join can be sufficiently secured and an image display device for which insulation is secured can be implemented. Further, the conductor wiring thickness of the bent portions 25 is low and, therefore, a highly reliable image display device for which flexural strength is secured can be implemented.

Another Embodiment

Figure 7:
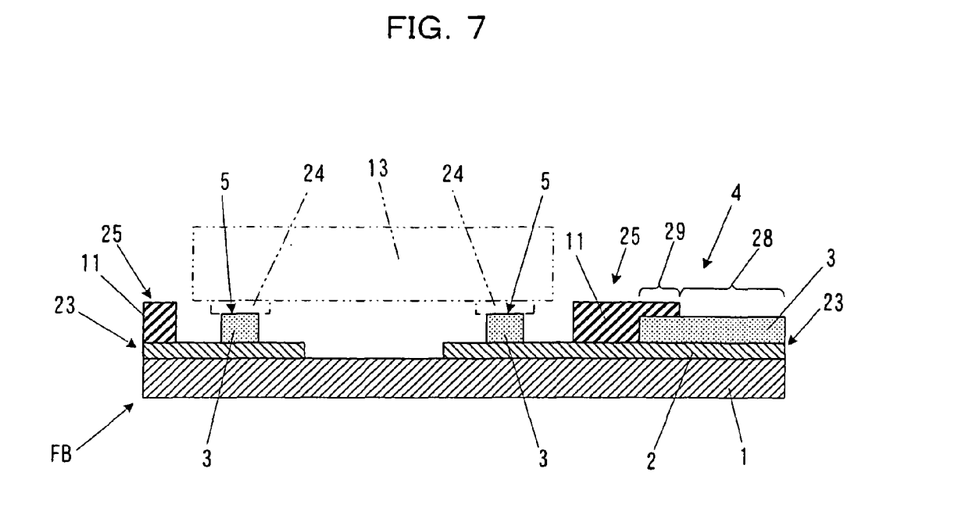
FIG. 7 is a cross section of a film substrate of another embodiment of the present invention.

Although the bent portions 25 of the film substrate FB (the bent portions that are bent during mounting on the image-display flat panel substrate 16 above the conductor wiring portion 23 formed on the film base material 1) are in an open state as shown in FIG. 1 in the above embodiment, a solder resist (an example of an insulating film) 11 can be formed as per the prior art on the bent portions 25 of the film substrate FB and the bent portions 25 can also be covered by the solder resist 11, as shown in FIG. 7. Thus, by covering at least the bent portions 25 by the solder resist 11, the strength of the bent portions 25 can be increased still further.

In addition, as shown in FIG. 7, the regions where a second conductor 3 is formed of the external connection portions 4 on the film substrate (the regions where the conductor wiring thickness is formed thick) can be formed larger than an external connection region 28 that is actually connected to the outside (a region where an electrode 15 of the image-display flat panel substrate 16 or an electrode 21 of the printed circuit substrate 20 is connected, for example) and the region 29 outside the external connection region 28 can also be covered by the solder resist (an example of an insulating film) 11. Therefore, by covering the region 29 outside the external connection region 28 by the solder resist (insulating film) 11, the edges of the region where the second conductor 3 is formed (the region where the conductor wiring thickness is formed thick) is reinforced by the solder resist (insulating film) 11. Therefore, the concentrations of stress on portions of variable conductor wiring thickness before and after mounting of the film substrate FB are alleviated and adequate strength can be secured.

Moreover, although the image-display flat panel 16 was illustrated as an example of the other panel to which the film substrate FB is connected and the printed circuit substrate of the image-display flat panel 16 was illustrated as an example of the other substrate, the other panel or other substrate may be a panel or substrate of another device.

Furthermore, the film substrate of the present invention makes it possible to secure adequately the gap at the join between the film substrate and panel substrate by reducing the pitch of the conductor wiring. Therefore, the wiring density is high, which is useful in fields in which thin-type image-display devices are sought.

What is claimed is:

1. A film substrate fabrication method for fabricating a film substrate, said method comprising:
    providing a film base material pre-formed with first conductor wiring comprising a semiconductor connection portion to be connected with a semiconductor element and an external connection portion on the film base material to be connected with another panel or substrate, the method subsequently comprising, sequentially:
    forming a photoresist on the surface of the film base material on which the first conductor wiring is formed;
    forming an opening and exposing a part of the first conductor wiring by removing the photoresist at a position of the external connection portion on the film base material and a position of the semiconductor connection portion;
    forming a second conductor wiring by performing metal plating on the first conductor wiring at the opening in the photoresist, whereby
    the photoresist remains on the surface of the film base material and on the surface of the first conductor wiring, and the surface of the second conductor wiring is exposed through the photoresist left on the surface of the first conductor wiring; and
    removing a first portion of the photoresist, other than the opening, and leaving a second portion of the photoresist, wherein the second portion of the photoresist is thinner than the first portion of the photoresist, thereby forming an insulating film of a photoresist which is thinner than the thicknesses of the external connection portion on the film base material and the semiconductor connection portion in a region other than the external connection portion on the film base material and the semiconductor connection portion.

2. The film substrate fabrication method according to claim 1, wherein a reinforcement conductor for film conveyance film holes is disposed on the film base material, and when forming an opening in the photoresist, the position of the reinforcement conductor portion is also opened and a further conductor is formed on the reinforcement conductor portion by performing metal plating.

3. The film substrate fabrication method according to claim 1, wherein when the first portion of the photoresist is removed, and the second portion of the photoresist is left, the surface of the second conductor wiring of the external connection portion on the film base material and the semiconductor connection portion is formed higher than the surface of the second photoresist portion.

4. The film substrate fabrication method according to claim 1, wherein a bent portion of the film base material is formed by the first conductor wiring on which the second conductor wiring is not formed.

* * * * *